United States Patent
Koizumi et al.

(10) Patent No.: US 10,199,246 B2
(45) Date of Patent: Feb. 5, 2019

(54) TEMPERATURE CONTROL MECHANISM, TEMPERATURE CONTROL METHOD AND SUBSTRATE PROCESSING APPARATUS

(71) Applicant: Tokyo Electron Limited, Tokyo (JP)

(72) Inventors: Katsuyuki Koizumi, Miyagi (JP); Shigeru Senzaki, Miyagi (JP); Tomoyuki Takahashi, Miyagi (JP); Dai Kitagawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 15/021,326

(22) PCT Filed: Oct. 16, 2014

(86) PCT No.: PCT/JP2014/077524
§ 371 (c)(1),
(2) Date: Mar. 11, 2016

(87) PCT Pub. No.: WO2015/060185
PCT Pub. Date: Apr. 30, 2015

(65) Prior Publication Data
US 2016/0225645 A1    Aug. 4, 2016

(30) Foreign Application Priority Data
Oct. 25, 2013  (JP) ................. 2013-221773

(51) Int. Cl.
*H01L 21/3065* (2006.01)
*H01L 21/683* (2006.01)
(Continued)

(52) U.S. Cl.
CPC .......... *H01L 21/67103* (2013.01); *F27B 5/14* (2013.01); *F27B 5/18* (2013.01);
(Continued)

(58) Field of Classification Search
CPC ......... H01L 21/67103; H01L 21/67248; H01L 21/6831; H01L 21/6833
(Continued)

(56) References Cited

U.S. PATENT DOCUMENTS

| 9,123,755 | B2 * | 9/2015 | Swanson | ........... H01L 21/67103 |
| 2011/0220288 | A1 * | 9/2011 | Kobayashi | .............. H01J 37/20 |
| | | | | 156/345.27 |
| 2016/0149482 | A1 * | 5/2016 | Criminale | ................. H02J 3/14 |
| | | | | 219/444.1 |

FOREIGN PATENT DOCUMENTS

| JP | S58-084314 | 5/1983 |
| JP | H02-129373 | 5/1990 |

(Continued)

*Primary Examiner* — Joseph M Pelham
(74) *Attorney, Agent, or Firm* — IPUSA, PLLC

(57) ABSTRACT

There is provided a temperature control mechanism comprising: a plurality of combinations of a heater and a thyristor, wherein at least one combination of the heater and the thyristor is provided on a zone-by-zone basis, and wherein an area of an electrostatic chuck for mounting a substrate is divided into a plurality of zones; a power supply configured to supply current to heaters of the plurality of combinations respectively through the thyristors of the plurality of combinations; a pair of filters disposed at a power supply line for supplying electric power from the power supply to the heaters and configured to eliminate high frequency power applied to the power supply.

5 Claims, 5 Drawing Sheets

(51) Int. Cl.
  *F27B 5/14*   (2006.01)
  *F27B 5/18*   (2006.01)
  *F27D 11/02*  (2006.01)
  *H01L 21/67*  (2006.01)
  *F27B 17/00*  (2006.01)
  *F27D 19/00*  (2006.01)

(52) U.S. Cl.
  CPC .... *H01L 21/67248* (2013.01); *H01L 21/6831* (2013.01); *H01L 21/6833* (2013.01); *F27B 17/0025* (2013.01); *F27D 11/02* (2013.01); *F27D 2019/0037* (2013.01)

(58) Field of Classification Search
  USPC ........................................................ 219/477
  See application file for complete search history.

(56) References Cited

FOREIGN PATENT DOCUMENTS

| | | |
|---|---|---|
| JP | H08-045909 | 2/1996 |
| JP | H08-138891 | 5/1996 |
| JP | 2002-093714 | 3/2002 |
| JP | 2005-268689 | 9/2005 |
| JP | 2006-049844 | 2/2006 |
| JP | 2009-173969 | 8/2009 |
| JP | 2010-225941 | 10/2010 |
| JP | 2013-508968 | 3/2013 |
| JP | 2013-513967 | 4/2013 |
| WO | 2011/049620 | 4/2011 |
| WO | 2011/081645 | 7/2011 |

\* cited by examiner

TEMPERATURE CONTROL MECHANISM, TEMPERATURE CONTROL METHOD AND SUBSTRATE PROCESSING APPARATUS

TECHNICAL FIELD

The present disclosure relates to temperature control mechanisms, temperature control methods and substrate processing apparatuses.

BACKGROUND ART

In a substrate processing such as etching, a temperature of an electrostatic chuck (ESC), on which a substrate is mounted is controlled, thereby controlling an etching rate. Recently, a heater integrated Electrostatic Chuck is proposed, in which a built-in heater for heating the electrostatic chuck is provided so as to improve responsiveness of a temperature control. For example, in Patent Documents 1-4, a mechanism for temperature control is disclosed, in which one heater is respectively included in a plurality of areas in the electrostatic chuck whereas the respective heaters independently perform the temperature control of the respective areas. A plurality of power supplies are coupled to the plurality of heaters on one-to-one basis, and the heaters are powered by respective power supplies.

CITATION LIST

Patent Document

[Patent Document 1]: Japanese Laid-open Patent Publication No. 2013-508968
[Patent Document 2]: Japanese Laid-open Patent Publication No. 2009-173969
[Patent Document 3]: Japanese Laid-open Patent Publication No. 2013-513967
[Patent Document 4]: Japanese Laid-open Patent Publication No. 2006-49844

SUMMARY OF INVENTION

Technical Problem

However, for example, in a case where the electrostatic chuck is divided into concentric regions, a portion of locally high temperature or low temperature may be included in each region, which causes the temperature control of the region to be difficult. Also, in such case, a desired local temperature control may be inapplicable. On the other hand, in a case where the electrostatic chuck is divided into a lot of areas to perform the temperature control locally, it is unrealistic to provide heaters on area-by-area basis so as to perform the temperature control independently in the respective areas in view of a space for disposing power supplies and cost.

An object of one aspect of the present disclosure is to provide a temperature control mechanism, temperature control method and substrate processing apparatus, with which performance of the temperature control of the electrostatic chuck in a local area can be achieved.

Solution to Problems

According to an embodiment of the present invention, there is provided a temperature control mechanism comprising: a plurality of combinations of a heater and a thyristor, wherein at least one combination of the heater and the thyristor is provided on a zone-by-zone basis, and wherein an area of an electrostatic chuck for mounting a substrate is divided into a plurality of zones; a power supply configured to supply current to heaters of the plurality of combinations respectively through the thyristors of the plurality of combinations; and a pair of filters disposed at a power supply line for supplying electric power from the power supply to the heaters and configured to eliminate high frequency power applied to the power supply.

According to another embodiment of the present invention, there is provided a temperature control method of a heat control mechanism including: a plurality of combinations of a heater and a thyristor, wherein at least one combination of the heater and the thyristor is provided on a zone-by-zone basis, and wherein an area of an electrostatic chuck for mounting a substrate is divided into a plurality of zones; a power supply configured to supply current to heaters of the plurality of combinations respectively through the thyristors of the plurality of combinations; and a pair of filters disposed at a power supply line for supplying electric power from the power supply to the heaters and configured to eliminate high frequency power applied to the power supply, the method comprising controlling current that is to be divided and supplied to the heaters respectively associated with the thyristors in the plurality of combinations based on a plurality of signals input to the thyristors.

According to another embodiment of the present invention, there is provided a substrate processing apparatus comprising: a plurality of combinations of a heater and a thyristor, wherein at least one combination of the heater and the thyristor is provided on a zone-by-zone basis, and wherein an area of an electrostatic chuck for mounting a substrate is divided into a plurality of zones; a power supply configured to supply current to heaters of the plurality of combinations respectively through the thyristors of the plurality of combinations; and a pair of filters disposed at a power supply line for supplying electric power from the power supply to the heaters and configured to eliminate high frequency power applied to the power supply.

Advantageous Effects of Invention

According to an embodiment, the temperature of the electrostatic chuck can be controlled locally.

DESCRIPTION OF EMBODIMENTS

Figure 1:
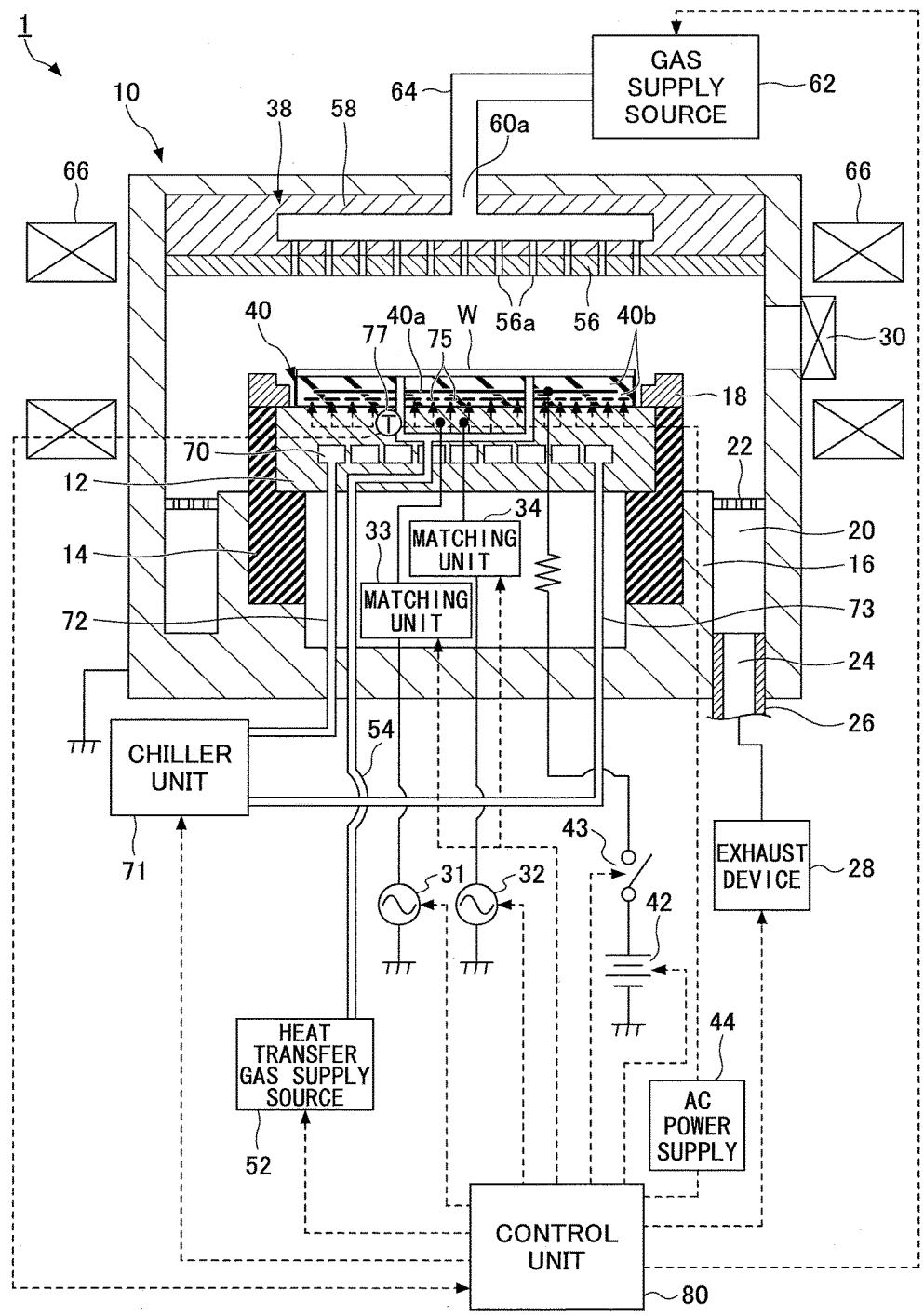
FIG. 1 is a diagram for illustrating a general arrangement of a plasma processing apparatus of the present embodiment.

Herein below, embodiments will be described with reference to the accompanying drawings. Additionally, in the present specification and drawings, identical reference numerals will be applied to elements or the like that have substantially similar functions and configurations to those in another embodiment, and descriptions thereof may be omitted.

<General Arrangement of Plasma Processing Apparatus>

First, a general arrangement of a plasma processing apparatus 1 of the present embodiment will be described with reference to FIG. 1. FIG. 1 is a diagram for illustrating the general arrangement of the plasma processing apparatus 1 of the present embodiment. The plasma processing apparatus 1 is configured as a lower side dual frequency capacitively coupled plasma etching apparatus. For example, the plasma processing apparatus 1 includes a cylindrical vacuum chamber (processing chamber) 10 made of aluminum having an alumite-treated (anodized) surface. The chamber 10 is grounded.

A mounting table 12 configured to hold a semiconductor wafer W (hereinafter, simply referred to as a "wafer W") as an example of a substrate thereon is provided within the chamber 10. The mounting table 12 may be made of aluminum Al, titanium Ti, silicon carbide SiC, etc, for example, and is supported on a cylindrical support 16 via an insulating cylindrical holder 14. The cylindrical support 16 extends vertically upward from a bottom of the chamber 10. To improve in-plane etching uniformity, a focus ring 18 that may be made of silicon, for example, is arranged on a top surface of the mounting table 12 to surround the outer edge of an electrostatic chuck 40.

An exhaust path 20 is formed between a sidewall of the chamber 10 and the cylindrical support 16. A ring-shaped baffle plate 22 is disposed in the exhaust path 20. An exhaust port 24 is formed at a bottom portion of the exhaust path 20 and is connected to an exhaust device 28 via an exhaust line 26. The exhaust device 28 includes a vacuum pump (not shown) and is configured to depressurize a processing space within the chamber 10 to a predetermined vacuum level. A gate valve 30 configured to open/close an entry/exit port for the wafer W is provided at the sidewall of the chamber 10.

A first high frequency power supply 31 for drawing ions and a second high frequency power supply 32 for plasma generation are electrically connected to the mounting table 12 via a matching unit 33 and a matching unit 34, respectively. The first high frequency power supply 31 applies a first high frequency power having a suitable frequency such as 0.8 MHz for drawing ions to the wafer W disposed on the mounting table 12. The second high frequency power supply 32 applies a second high frequency power to the mounting table 12, where the second high frequency power has a frequency such as 60 MHz for generating plasma within the chamber 10 to the mounting table 12. In this way, the mounting table 12 also serves as a lower electrode. A shower head 38, which is described below, is provided at a ceiling portion of the chamber 10. The shower head 38 serves as an upper electrode at a ground potential. Thus, the high frequency power from the second high frequency power supply 32 is capacitively applied between the mounting table 12 and the shower head 38.

The electrostatic chuck 40 configured to hold the wafer W by an electrostatic attractive force is provided on the top surface of the mounting table 12. The electrostatic chuck 40 includes an electrode 40a that is made of a conductive film and is arranged between a pair of insulating layers 40b or a pair of insulating films. A DC voltage supply 42 is electrically connected to the electrode 40a via a switch 43. The electrostatic chuck 40 electrostatically attracts and holds the wafer W by a Coulomb force that is generated when a voltage is applied thereto from the DC voltage supply 42.

A heat transfer gas supply source 52 is configured to supply a heat transfer gas such as He gas between the top surface of the electrostatic chuck 40 and the backside surface of the wafer W through a gas supply line 54.

The shower head 38 disposed at the ceiling portion includes an electrode plate 56 having multiple gas holes 56a and an electrode supporting body 58 configured to detachably hold the electrode plate 56. The gas supply source 62 supplies gas to the shower head 38 via a gas supply pipe 64, which is connected to a gas inlet 60a. In this way, the gas is introduced into inside of the chamber 10 from the multiple gas holes 56a.

A magnet 66 is arranged to extend annularly or concentrically around the chamber 10 so as to preform control of plasma within a plasma generation space of the chamber 10 by means of the magnetic force of the magnet 66.

A coolant path 70 is formed within the mounting table 12. A coolant cooled to a predetermined temperature is supplied to the coolant path 70 from a chiller unit 71 via pipes 72 and 73. Also, a plurality of heaters 75 are integrated in the electrostatic chuck 40. At least one heater of the heaters 75 is provided at each zone in a case where the electrostatic chuck 40 is divided into a plurality of zones (areas). Also, the multiple heaters 75 may be attached to a backside surface of the electrostatic chuck 40 instead of being integrated in the electrostatic chuck 40. A desired AC voltage is applied to the heater 75 from an AC power supply 44. According to above-described configuration, the temperature of the wafer W can be adjusted to a desired temperature through cooling by the chiller unit 71 and heating by the heaters 75. Also, such temperature control is performed based on a command from a control unit 80.

The control unit 80 controls respective components of the plasma processing apparatus 1 such as the exhaust device 28, the AC power supply 44, the DC voltage supply 42, the switch 43 for the electrostatic chuck, the first high frequency power supply 31, the second high frequency power supply 32, the matching units 33 and 34, the heat transfer gas supply source 52, the gas supply source 62, and the chiller unit 71. Also, the control unit 80 acquires information indicating temperature detected by a temperature measuring unit 77 such as a thermoelectric couple attached to the backside surface of the electrostatic chuck 40. Additionally, the control unit 80 is also connected to a host computer (not shown).

The control unit 80 includes a CPU (Central Processing Unit), and a storage unit such as a ROM (Read Only Memory), a RAM (Random Access Memory), a HDD (Hard Disk Drive), etc., which are not shown. The CPU performs a plasma process according to various recipes in which processes or conditions of the plasma process is defined. The storage unit storing the recipes may be configured by RAM or ROM using a semiconductor memory, a magnetic disk, or an optical disk, for example. The recipes may be stored in a recording medium and loaded in the storage unit via a driver (not shown), for example. Alternatively, the recipes may be downloaded to the storage unit via a network (not shown), for example. Also, note that a DSP (digital signal processor) may be used instead of the CPU to perform the above functions. Additionally, the functions of the control unit 80 may be implemented by software, hardware, or a combination thereof.

When performing an etching process using the plasma processing apparatus 1 having the above-described configuration, the temperature of the wafer W is adjusted to a desired temperature through cooling by the chiller unit 71 and heating by the heaters 75. The temperature control is performed based on a command from the control unit 80.

The gate valve 30 is opened, and the wafer W is loaded into the chamber 10 while being held by a transfer arm. The wafer W is held by pusher pins (not shown), and the wafer W is placed on the electrostatic chuck 40 when the pusher pins are lowered. After the wafer W is loaded, the gate valve 30 is closed. Then, an etching gas is introduced into the chamber 10 from the gas supply source 62 at a predetermined flow rate and flow rate ratio, and the internal pressure of the chamber 10 is reduced to a predetermined pressure by the exhaust device 28. Further, high frequency powers at predetermined power levels are supplied to the mounting table 12 from the first high frequency power supply 31 and the second high frequency power supply 32. Also, a voltage from the DC voltage supply 42 is applied to the electrode 40a of the electrostatic chuck 40 so that the wafer W is fixed to the electrostatic chuck 40. The heat transfer gas supply source 52 supplies a heat transfer gas between the top surface of the electrostatic chuck 40 and the backside surface of the wafer W. Etching gas sprayed into the chamber 10 from the shower head 38 is excited into plasma by the high frequency power from the second high frequency power supply 32. As a result, plasma is generated within the plasma generation space between the upper electrode (shower head 38) and the lower electrode (mounting table 12), and a main surface of the wafer W is etched by radicals or ions of the generated plasma. Also, ions can be drawn toward the wafer W by the high frequency power from the first high frequency power supply 31.

After plasma etching is completed, the wafer W is lifted and held by the pusher pins, the gate valve 30 is opened, and the transfer arm is introduced into the chamber 10. Then, the pusher pins are lowered so that the wafer W is held by the transfer arm. Then, the transfer arm exits the chamber 10, and a next wafer W is loaded into the chamber 10 by the transfer arm. By repeating the above-described procedures, wafers W may be successively processed.

Hereinabove, the general arrangement of the plasma processing apparatus of the present embodiment has been described.

<Heat Control Zones in Electrostatic Chuck>

Figure 2A:
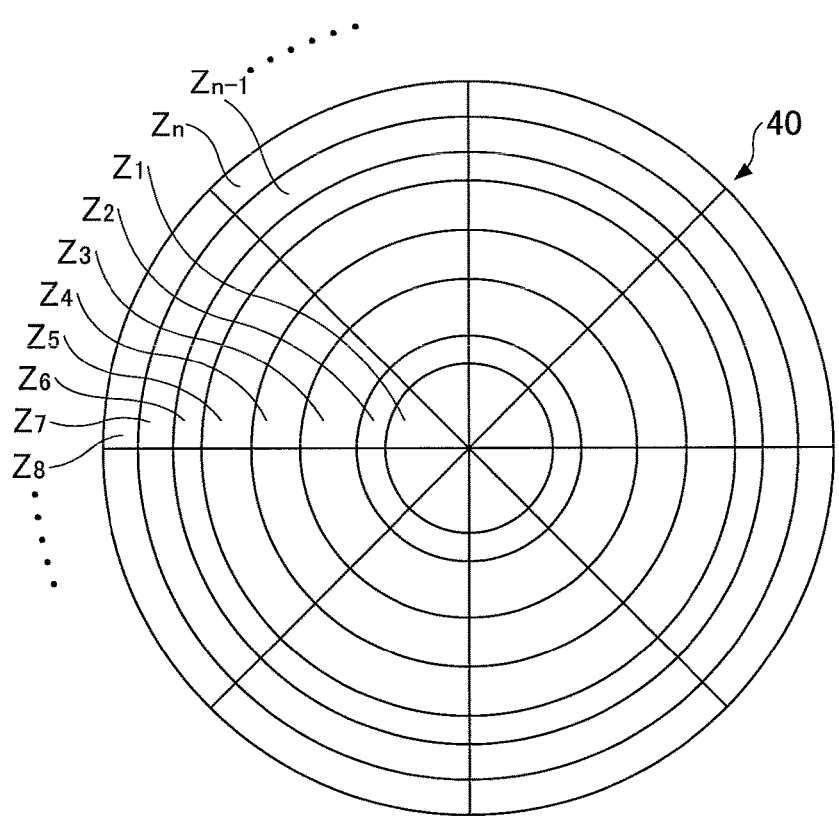
FIG. 2A is a diagram for illustrating an example of a segmentalized electrostatic chuck that includes multiple zones.

In the following, shapes of respective areas (zones) created by segmentalizing the electrostatic chuck 40 will be described with reference to FIG. 2A and FIG. 2B. FIG. 2A is a diagram for illustrating an example of segmentalized electrostatic chuck 40 that includes multiple zones. In the present embodiment, the electrostatic chuck 40 is divided into multiple zones $Z_1$-$Z_n$ (hereinafter, also collectively referred to as "zones Z"), where the temperature control is independently performed on the respective zones Z.

For example, as shown in FIG. 2A, the multiple zones $Z_1$-$Z_n$ created by segmentalizing the electrostatic chuck 40 may be 64 arc-like zones ($Z_1, Z_2, \ldots Z_n$: n=64). In this case, shapes of the respective zones are created by dividing the electrostatic chuck 40 in circumferential direction into respective annular shapes, and further dividing respective annular shapes into equable arcs. The shapes of respective zones are preferable to control the temperature of a disk-shaped wafer to be uniform. Also, concentric zones are not included in the above-described zones. In a case where the electrostatic chuck is divided into concentric zones, a portion (singular point) of locally high temperature or low temperature may be included in each zone, which causes the temperature control of the zone to be difficult. On the other hand, concentric zones are not included in the above-described zones. Therefore, the portion of locally high temperature or low temperature is unlikely to exist in each zone. Hence, in-plane temperature uniformity of the electrostatic chuck 40 is improved and the shapes of respective zones are preferable to control the temperature of the wafer to be uniform.

Figure 2B:
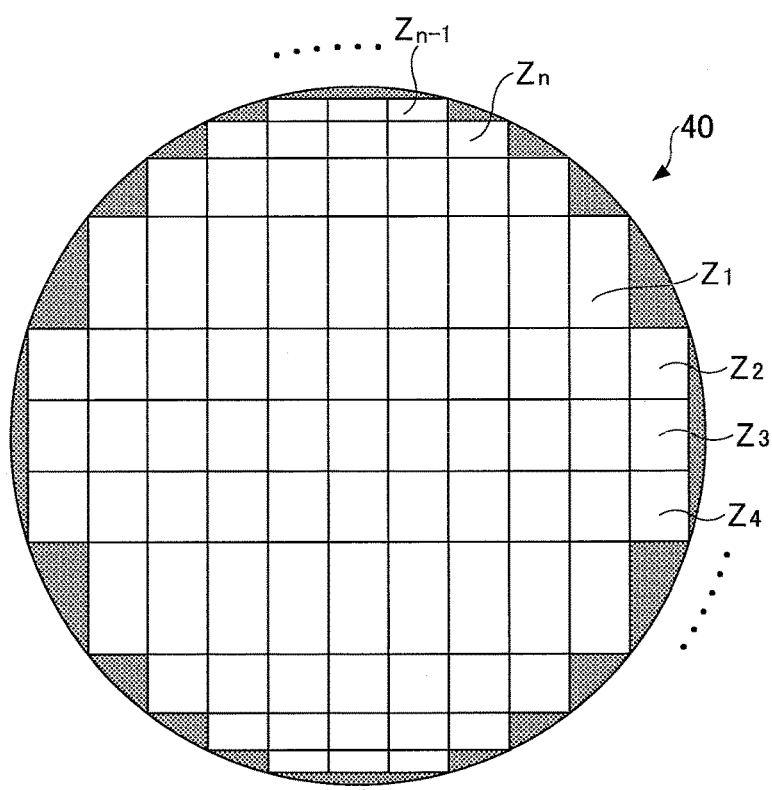
FIG. 2B is a diagram for illustrating another example of a segmentalized electrostatic chuck that includes multiple zones.

FIG. 2B is a diagram for illustrating an example of segmentalized electrostatic chuck 40 that includes 81 rectangular zones ($Z_1, Z_2, \ldots Z_n$: n=81). The chips formed on the wafer are rectangular. Therefore, the shape of the zones is preferable in that the rectangular zones Z are provided for respective chips formed on the wafer to locally control the temperature of the respective zones Z, thereby achieving a temperature management on a chip-by-chip basis.

As described above, in the present embodiment, the electrostatic chuck 40 is divided into multiple zones Z, where the temperature control can be independently performed on the respective zones Z. Thus, the in-plane temperature of the electrostatic chuck 40 can be adjusted locally. Also, in the present embodiment, the electrostatic chuck 40 is divided into multiple zones Z other than concentric zones, where the temperature control is independently performed on the respective zones Z. Thus, the in-plane temperature uniformity of the electrostatic chuck 40 is improved. Also, any shapes of the multiple zones Z created by segmentalizing the electrostatic chuck 40 may be chosen except the concentric shape. However, a sufficient number of zones are preferably provided so that the temperature of the electrostatic chuck 40 can be controlled locally, or the in-plane temperature uniformity of the electrostatic chuck 40 is improved. Additionally, a resistance value (heating value) of the heater 75 with respect to the area of the zone Z is preferably to be even in respective zones Z. However, the resistance values may be not exactly the same.

<Temperature Control Mechanism of Electrostatic Chuck>

Figure 3:
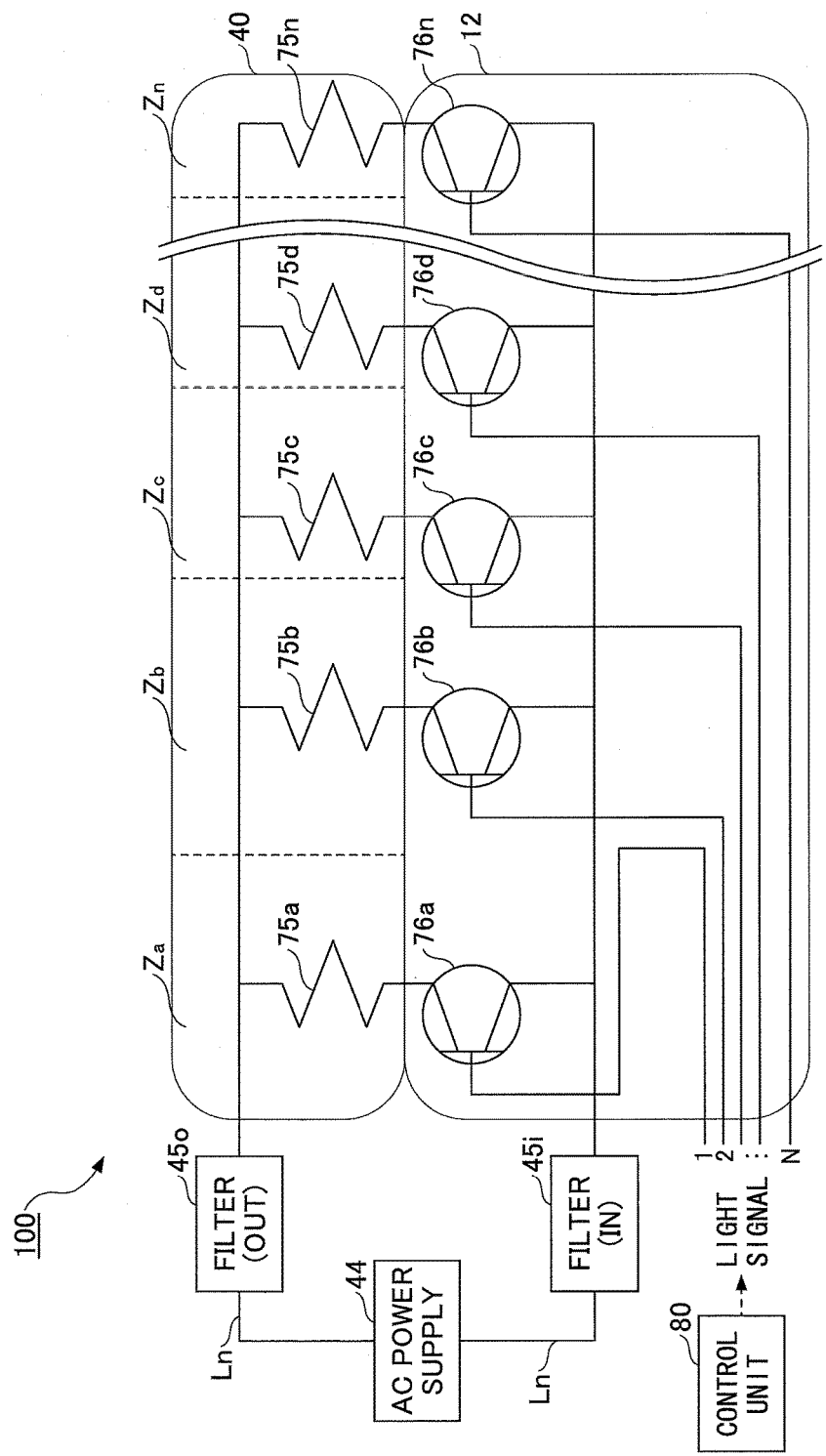
FIG. 3 is a diagram for illustrating an example temperature control mechanism of the present embodiment.

In the following, a temperature control mechanism 100 for performing the temperature control of the electrostatic chuck 40 will be described with reference to FIG. 3. FIG. 3 is a diagram for illustrating an example temperature control mechanism 100 of the present embodiment. The temperature control mechanism 100 is included in the plasma processing apparatus 1 that is an example of the substrate processing apparatus.

The temperature control mechanism 100 of the present embodiment performs the temperature control on the multiple zones Z created by segmentalizing the electrostatic chuck 40 in a manner such that the temperature of the respective zones Z are controlled independently. For that, the temperature control mechanism 100 of the present embodiment includes at least a combination of the heater 75 and an optical trigger thyristor 76 with respect to each zone Z of the multiple zones Z in the electrostatic chuck 40. Also, the temperature control mechanism 100 of the present embodiment includes at least an AC power supply 44 and a pair of filters 45. For example, as shown in FIG. 3, the temperature control mechanism 100 of the present embodiment includes combinations of the heaters 75a-75n (collectively referred to as "heaters 75") and optical trigger thyristors 76a-76n (collectively referred to as "optical trigger thyristors 76") corresponding to respective zones Za-Zn so as to perform the temperature control of the electrostatic chuck 40 divided into n zones Za-Zn. However, numbers of the heaters 75 and the optical trigger thyristors 76 are not limited to the above-described example as long as at least a combination of the heater 75 and the optical trigger thyristor 76 is provided with respect to each zone. For example, a plurality of combinations of the heater 75 and the optical trigger thyristor 76 may be provided with respect to each zone.

Also, in the temperature control mechanism 100 of the present embodiment, the heaters 75 are integrated in the electrostatic chuck 40, while the optical trigger thyristors 76 are integrated in the mounting table 12. However, heaters 75 may be formed in a sheet-shape and attached to the backside surface of the electrostatic chuck 40 instead of being integrated. By providing the heaters 75 inside or at the backside surface of the electrostatic chuck 40, the responsiveness in the temperature control can be improved when the temperature of electrostatic chuck 40 is adjusted by the heaters 75. The optical trigger thyristors 76 are preferably integrated in the mounting table 12 or the electrostatic chuck 40 when considering influence of high frequency power applied to the mounting table 12.

For example as shown in FIG. 2, in the temperature control mechanism 100 of the present embodiment, current is supplied to heaters 75 respectively included in 50 or more zones Z that is an example of multiple zones to heat the respective zones Z separately, thereby achieving performance of the local temperature control on a zone-by-zone basis. In the above-described mechanism, it is unrealistic to provide power supplies on heater 75-by-heater 75 basis, where the respective heaters 75 are included in the multiple zones Z in view of increased space for disposing power supplies and increased cost.

Therefore, in the temperature control mechanism 100 of the present embodiment, one AC power supply 44 is provided with respect to a plurality of combinations of the heaters 75a-75n and the optical trigger thyristors 76a-76n. The optical trigger thyristor 76 is a transistor having a function for dividing the current and can be used with a high electric power. The optical trigger thyristor 76 divides the current supplied from AC power supply 44 in accordance with an input light signal, and supplies the divided current to the heater 75. The optical trigger thyristor 76 is an example of a thyristor for dividing the current supplied from AC power supply 44 in accordance with an input light signal. The use of the optical trigger thyristor 76, with which erroneous operations are prevented, is preferable because noise caused by the high frequency power can be eliminated in the light signal.

As described above, the AC power supply 44 supplies desired current to respective heaters 75a-75n by dividing the output current through the optical trigger thyristors 76a-76n. When at least one heater 75 is included in each zone Z, the temperature control of the respective zones Z can be performed independently by heating the heaters 75 with desired current.

Also, in a case where a plurality of power supplies are provided on heater 75-by-heater 75 basis, a power supply coupled to the heater 75 included in a zone Z does not operate while the heating of the zone Z is not required. Hence, the resource cannot be effectively used.

On the other hand, in the temperature control mechanism 100 of the present embodiment, one AC power supply 44 supplies current to respective heaters 75a-75n by dividing the output current through the optical trigger thyristors 76a-76n. Therefore, the AC power supply 44 generally needs to supply the current to any one of the heaters 75, and there is little period in which the AC power supply 44 does not operate. Thus, in the temperature control mechanism 100 of the present embodiment, an operation rate of the AC power supply 44 is improved to achieve effective resource utilization by performing the temperature control of the multiple zones Z in parallel using one AC power supply 44.

The filter 45 is coupled to a power supply line Ln for supplying electric power to a plurality of the heaters 75 from the AC power supply 44. The at least a pair of the filters 45 is configured by a filter 45i disposed on input side of heaters 75 and a filter 45o disposed on output side thereof.

For example, the filter 45 is formed by a coil, and protects the AC power supply 44 by eliminating the high frequency power applied to the AC power supply 44. In the present embodiment, only one AC power supply and one filter 45 are required. Therefore, a space is provided in lower side of the mounting table 12, which allows an effective utilization of the space.

Herein above, the temperature control mechanism 100 of the present embodiment has been described. Lastly, a temperature control method of the present embodiment will be described with reference to FIG. 4.

<Temperature Control Method of Electrostatic Chuck>

Figure 4:
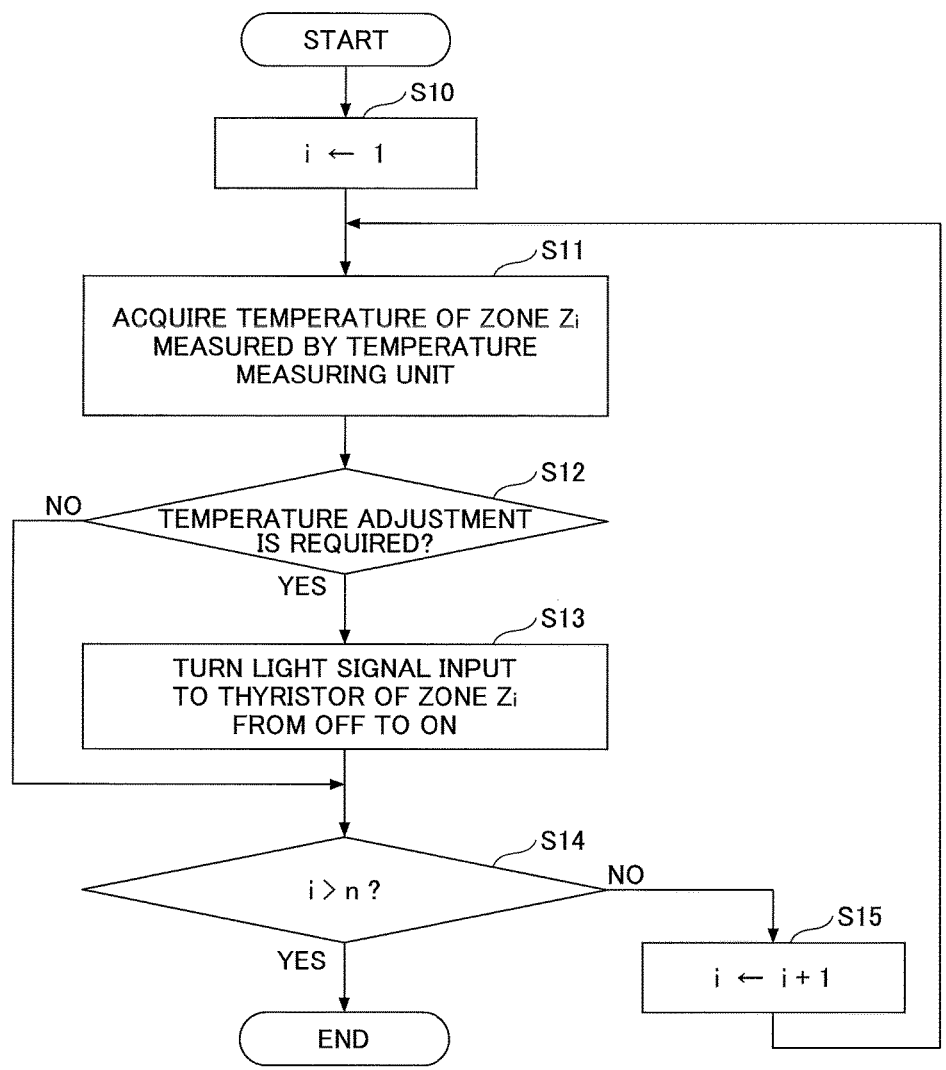
FIG. 4 is a flowchart for illustrating an example temperature control method of the present embodiment.

FIG. 4 is a flowchart for illustrating an example temperature control method of the present embodiment. As described below, in a case where the electrostatic chuck 40 is divided into n zones $Z_1$-$Z_n$, the controls with respect to the temperatures of the respective zones Z are independently performed in accordance with the light signals 1-n controlled by the control unit 80.

Upon the temperature control process shown in FIG. 4 starting, a variable "i" indicating a zone that is a control target of the temperature control process is substituted by "1" (step S10). Then, the control unit 80 acquires temperature measured by the temperature measuring unit 77 (step S11). A configuration of the temperature measuring unit 77 may be arbitrarily chosen as long as it has a function for measuring temperatures of the respective zones. For example, the temperature measuring unit 77 may scan the backside surface of the electrostatic chuck 40 to detect the temperatures of the respective zones. For example, the temperature measuring unit 77 may be thermoelectric couples or temperature sensors disposed at respective zones or predetermined positions of the electrostatic chuck 40.

The control unit 80 determines whether to perform temperature adjustment of the zone $Z_1$ based on a difference between the measured temperature and a set temperature (target temperature) (step S12). In a case where it is determined that the temperature adjustment is not required, the process is forwarded to step S14. On the other hand, in a case where it is determined that the temperature adjustment is required, the control unit 80 turns the light signal that is input to the optical trigger thyristor 76a from off to on (step S13), and the process is forwarded to step S14. Thus, desired current is supplied to the heater 75a included in the zone $Z_1$, and thereby controlling the temperature of the zone $Z_1$ to be a desired temperature with the heated heater 75a.

The control unit 80 determines whether the variable "i" is greater than "n" indicating a number of the zones (step S14). In a case where the variable "i" is equal to or less than "n", the variable "i" is incremented by "1" (step S15), and the process returns to step S11. The control unit 80 performs respective processes of steps S11-S14 to perform the temperature control of the next zone Z.

Currently, the variable "i" is "1" that is less than "n". Therefore, the process is forwarded from step S14 to step S15, where the variable "i" becomes "2".

The control unit 80 performs processes of steps S11-S14, and thereby performs the temperature control process of the zone $Z_2$. As described above, the control unit 80 repeatedly performs the processes of steps S11-S14 until the variable "i" becomes greater than "n", and thereby independently adjusts the respective temperatures of zones $Z_1$-$Z_n$. In a case where the variable "i" becomes greater than "n", the temperature control process is terminated because it is determined that the temperature adjustment of zones $Z_1$-$Z_n$ is all completed.

Hereinabove, the temperature control mechanism 100, a temperature control method using the temperature control mechanism 100 and the plasma processing apparatus 1 including the temperature control mechanism 100 of the present embodiment have been described.

According to the above descriptions, the electrostatic chuck 40 is divided into multiple zones Z, where concentric zones are not included. The temperature control is performed on the respective zones Z of the electrostatic chuck 40 independently. Therefore, the portion of locally high temperature or low temperature is unlikely to exist in each zone.

Also, in the temperature control mechanism 100, at least one combination of the heater 75 and optical trigger thyristor 76 is provided corresponding to respective zones Z. The control unit 80 controls the light signal input to the respective optical trigger thyristors 76. Thus, independent heat adjustment of respective zones Z of the electrostatic chuck 40 can be performed by heating the heaters 75 using the current supplied from one AC power supply 44 and divided. Therefore, the temperature of the respective zones Z can be locally adjusted. Hence, the in-plane temperature uniformity of the electrostatic chuck 40 is improved. Also, a desired in-plane temperature distribution of the electrostatic chuck 40 can be generated.

Additionally, in the embodiment described above, the control unit 80 adjusts the current supplied to the heaters 75 of the respective zones Z by performing a pulse control of the light signal. However, the above described control of the signal input to the optical trigger thyristor 76 is not a limiting example. For example, the control unit 80 may control any of the pulse, intensity, and frequency of the light signal input to the optical trigger thyristor 76. Thus, the current supplied to the heaters 75 of the respective zones Z can be controlled.

Also, for example, in the temperature control method of the present embodiment, the light signal input to the optical trigger thyristors 76a-76n may be controlled based on the temperature detected when the substrate is processed just before, or the temperature detected in real-time.

Herein above, although the temperature control mechanism, the temperature control method and the substrate processing apparatus have been described with respect to a above described embodiment for a complete and clear disclosure, the temperature control mechanism, the temperature control method and the substrate processing apparatus of the present invention are not to be thus limited but are to be construed as embodying all modifications and alternative constructions within a range of the present invention. Also, the above described embodiment and a modification or alternative construction may be combined without including inconsistency.

Also, the substrate processing apparatus of the present invention can be applied to a plasma processing apparatus including an etching processing apparatus, an ashing processing apparatus, a film forming apparatus, and the like. In the apparatuses, plasma generation can be achieved by, as well as a generation means of Capacitively Coupled Plasma (CCP) shown in FIG. 1, a generation means of Inductively Coupled Plasma (ICP), a generation means of Helicon Wave Plasma (HWP), a generation means of an microwave excited surface wave plasma including microwave plasma generated by a radial line slot antenna and Slot Plane Antenna (SPA) plasma, a generation means of an Electron Cyclotron Resonance Plasma (ECR), a generation means of remote plasma using above described generation means, and the like.

The substrate processed in a manner of the present invention is not limited to the wafer (semiconductor) described in the embodiment. However, for example, the substrate processed in a manner of the present invention may be a large substrate for a Flat Panel Display, or a substrate for a EL element or a solar battery.

The present application is based on Japanese Priority Application No. 2013-221773 filed on Oct. 25, 2013, the entire contents of which are hereby incorporated herein by reference.

REFERENCE SIGNS LIST 1 plasma processing apparatus
12 mounting table
40 electrostatic chuck
44 AC power supply
45 filter
75 heater
76 optical trigger thyristor
80 control unit
Z zone of electrostatic chuck

The invention claimed is:

1. A temperature control mechanism comprising:
   a plurality of combinations of a heater and a thyristor, wherein at least one combination of the heater and the thyristor is provided on a zone-by-zone basis, and wherein an area of an electrostatic chuck for mounting a substrate is divided into a plurality of zones;
   a power supply configured to supply current to heaters of the plurality of combinations respectively through thyristors of the plurality of combinations; and
   a pair of filters disposed at a power supply line for supplying electric power from the power supply to the heaters and configured to eliminate high frequency power applied to the power supply, the pair of filters including a first filter provided to an input side relative to the heater and a second filter provided to an output side relative to the heater.

2. The temperature control mechanism according to claim 1, wherein
   the plurality of zones of divided areas of the electrostatic chuck are formed in shapes excluding a concentric shape.

3. The heat control mechanism according to claim 1, wherein
   the plurality of zones of divided areas of the electrostatic chuck are formed in an arc-like shape or a rectangular shape.

4. The temperature control mechanism according to claim 1, wherein the heater is embedded in the electrostatic chuck and the thyristor is embedded in a mounting table.

5. The heat control mechanism according to claim 1, wherein the electrostatic chuck is divided into a plurality of circle sectors and each circle sector is further divided into the plurality of zones, each of the plurality of zones having an arc-like shape or a rectangular shape with a different distance from a center of the electrostatic chuck.

* * * * *